US012750071B2

(12) United States Patent
Hao et al.

(10) Patent No.: US 12,750,071 B2
(45) Date of Patent: Sep. 29, 2026

(54) HIGH-PERFORMANCE SCL BIT-FLIP DECODER FOR CONCATENATED POLAR CODES

(71) Applicant: BRITISH TELECOMMUNICATIONS PUBLIC LIMITED COMPANY, London (GB)

(72) Inventors: Mo Hao, China (CN); Linglong Dai, London (GB); Jieao Zhu, London (GB); Zhongzhichao Wan, London (GB); Richard Mackenzie, London (GB)

(73) Assignee: BRITISH TELECOMMUNICATIONS PUBLIC LIMITED COMPANY, London (GB)

(*) Notice: Subject to any disclaimer, the term of this patent is extended or adjusted under 35 U.S.C. 154(b) by 0 days.

(21) Appl. No.: 18/839,563

(22) PCT Filed: Feb. 1, 2023

(86) PCT No.: PCT/EP2023/052462
§ 371 (c)(1),
(2) Date: Aug. 19, 2024

(87) PCT Pub. No.: WO2023/156200
PCT Pub. Date: Aug. 24, 2023

(65) Prior Publication Data
US 2025/0167810 A1 May 22, 2025

(30) Foreign Application Priority Data
Feb. 21, 2022 (WO) ................ PCT/CN2022/077124

(51) Int. Cl.
*H03M 13/29* (2006.01)
*H03M 13/13* (2006.01)

(52) U.S. Cl.
CPC ... *H03M 13/2906* (2013.01); *H03M 13/2927* (2013.01); *H03M 13/13* (2013.01)

(58) Field of Classification Search
CPC ...................... H03M 13/2906; H03M 13/2927
See application file for complete search history.

(56) References Cited

U.S. PATENT DOCUMENTS

2019/0165818 A1* 5/2019 Miyazaki .............. H04L 1/0057
2019/0372591 A1* 12/2019 Chen ................. H03M 13/1108
(Continued)

FOREIGN PATENT DOCUMENTS

| | | |
|---|---|---|
| CN | 108566213 A | 9/2018 |
| CN | 110474648 A | 11/2019 |
| CN | 114070331 A | 2/2022 |

OTHER PUBLICATIONS

F. Cheng, A. Liu, J. Ren and K. Feng, "CRC-Aided Parity-Check Polar Coding," in IEEE Access, vol. 7, pp. 155574-155583, 2019, (Year: 2019).*
(Continued)

*Primary Examiner* — Joseph D Torres
(74) *Attorney, Agent, or Firm* — EIP US LLP

(57) ABSTRACT

A method of encoding a concatenated polar code is provided, including evaluating channel reliabilities; selecting channels based on each channel's relative reliability; constructing a polar code of information bits arranged with a front and a rear; attaching additional cyclic redundancy checking (CRC) bits to the rear of the information bits; inserting parity bits at proper locations to yield a bit string; feeding the bit string into a polar encoder; and obtaining a codeword. A successive cancellation list and bit flipping decoding method for concatenated polar code also is provided, including initializing a LLR of the codeword; screening paths; performing a CRC check on the screened paths and if the CRC check is not met; determining, in response
(Continued)

to the CRC check not being met, at least one most unreliable bit based on a revised critical set (RCS); reversing a previous decision if the most unreliable bit was previously selected; and restarting the decoding method.

3 Claims, 8 Drawing Sheets

(56) References Cited

U.S. PATENT DOCUMENTS

| | | | | |
|---|---|---|---|---|
| 2020/0186170 | A1* | 6/2020 | Hui | H03M 13/091 |
| 2021/0013902 | A1 | 1/2021 | Jang et al. | |
| 2021/0143843 | A1 | 5/2021 | Nimbalker et al. | |
| 2021/0391945 | A1 | 12/2021 | Chaki et al. | |
| 2023/0155606 | A1* | 5/2023 | Chaki | H03M 13/611 714/759 |

OTHER PUBLICATIONS

International Preliminary Report on Patentability received for PCT Patent Application No. PCT/EP2023/052462, mailed on May 28, 2024, 19 pages.

International Search Report and Written Opinion received for PCT Patent Application No. PCT/CN2022/077124, mailed on Nov. 22, 2022, 11 pages.

International Search Report and Written Opinion received for PCT Patent Application No. PCT/EP2023/052462, mailed on Mar. 15, 2023, 21 pages.

Written Opinion of the International Preliminary Examining Authority received for PCT Patent Application No. PCT/EP2023/052462, mailed on Jan. 12, 2024, 11 pages.

Afisiadis , et al., "A Low-Complexity Improved Successive Cancellation Decoder for Polar Codes", Available at: arXiv:1412.5501v1, Dec. 17, 2014, 5 pages.

Arikan , "Channel Polarization: A Method for Constructing Capacity-achieving Codes for Symmetric Binary-input Memoryless Channels", Available at: arXiv:0807.3917v5, Jul. 20, 2009, pp. 1-23.

Niu , et al., "CRC-Aided Decoding of Polar Codes", IEEE Communications Letters, vol. 16, No. 10, Oct. 2012, pp. 1668-1671.

Vangala , et al., "A Comparative Study of Polar Code Constructions for the AWGN Channel", Available at: arXiv:1501.02473v1, Jan. 11, 2015, pp. 1-9.

Wang , et al., "Parity-Check-Concatenated Polar Codes", IEEE Communications Letters, vol. 20, No. 12, Dec. 2016, pp. 2342-2345.

Wu, et al., "Construction and Block Error Rate Analysis of Polar Codes Over AWGN Channel Based on Gaussian Approximation", IEEE Communications Letters, vol. 18, No. 7, Jul. 2014, pp. 1099-1102.

Yu , et al., "Hybrid Parity-check and CRC Aided SCL Decoding for Polar Codes", IEEE International Conference on Internet of Things (iThings) and IEEE Green Computing and Communications (GreenCom) and IEEE Cyber, Physical and Social Computing (CPSCom) and IEEE Smart Data (SmartData), Dec. 15, 2016, pp. 711-716.

Yu , et al., "Successive Cancellation List Bit-flip Decoder for Polar Codes", Proceeding of 10th International Conference on Wireless Communications and Signal Processing, Oct. 18, 2018, 6 pages.

Yuan , et al., "Double-Parity-Check CA-SCL Encoding and Decoding for Polar Codes", 14th IEEE International Conference on Signal Processing, Aug. 12, 2018, pp. 747-751.

Zhang , et al., "Parity-check Polar Coding for 5G and Beyond", Proceedings of IEEE Internatinal Conference on Communications, May 20, 2018, 7 pages.

EP Exam Report for EP 23703179.4 dated Jun. 19, 2026, 6 pages.

* cited by examiner

HIGH-PERFORMANCE SCL BIT-FLIP DECODER FOR CONCATENATED POLAR CODES

PRIORITY CLAIM

The present application is a National Phase entry of PCT Application No. PCT/EP2023/052462, filed Feb. 1, 2023, which claims priority from PCT Application No. PCT/CN2022/077124, filed Feb. 21, 2022, each of which hereby fully incorporated herein by reference.

TECHNICAL FIELD

This disclosure relates to coding methods and apparatuses, and more particularly to a method and apparatus for concatenated polar coding with a bit-flip decoder in a data communication system.

BACKGROUND

Communication links are susceptible to errors due to random noise, interference, device impairments, etc. that corrupt the original data stream at the receiving end. One means of mitigating these errors is through channel coding, which employs a set of algorithmic operations on the original data stream at the transmitter, and another set of operations on the received data stream at the receiver to correct errors. In channel coding terminology, the entirety of these operations at the transmitter and receiver are respectively denoted as encoding and decoding operations. A major challenge of developing high performance channel codes that mitigate the effect of the errors in a communication link is doing this in a manner of sufficiently low complexity to allow practical implementation. The complexity of a code impacts a number of critical parameters, e.g., how much power it consumes, how much memory it needs, how much computation power it requires, and how much latency it incurs, all of which determine whether a code is a good fit for a particular use case. Polar code is a channel coding technique with excellent error-correction capability. E. Arikan, "Channel polarization: a method for constructing capacity-achieving codes for symmetric binary-input memoryless channels," IEEE Trans. Inf. Theory, vol. 55, no. 7, pp. 3051-3073. July 2009. However, pure polar code is inferior in performance to some other coding schemes such as Low-Density Parity-Check (LDPC) codes and Turbo codes.

Concatenated codes are a form of error-correcting codes that are constructed from two or more simpler codes to achieve good performance with reasonable complexity. Turbo codes and other modern capacity-approaching codes may be regarded as elaborations of this approach. Some forms of concatenated polar codes have been proposed, but have suffered from a large gap towards the finite blocklength Shannon limit due to insufficient mutual information harnessing.

Traditional decoding algorithms of polar codes can be divided into two categories: Successive Cancellation (SC) decoders and Belief Propagation (BP) decoders. SC decoders estimates the information sequence $$u_1^N$$

sequentially by calculating the Log Likelihood Ratio (LLR) of each $u_i$ recursively:

$$LLR(u_i) = \log\frac{\mathbb{P}\left[y_1^N, u_1^{i-1} | u_i = 0\right]}{\mathbb{P}\left[y_1^N, u_1^{i-1} | u_i = 1\right]}$$

And the decision is based on the sign of LLR($u_i$).

Belief propagation, also known as sum-product message passing, is a message-passing algorithm for performing inference on graphical models and was first proposed by Judea Pearl in 1982. It was formulated as an exact inference algorithm on trees but was later extended to polytrees. While it is not exact on general graphs, it has been shown to be a useful approximate algorithm. Belief propagation is commonly used in artificial intelligence and information theory and has demonstrated empirical success in numerous applications including low-density parity-check codes, turbo codes, free energy approximation, and satisfiability. Thus, there exists an unmet need in the art for a solution to encoding and decoding that approaches the Shannon limit, and achieves (or at least approximates) the finite-length theoretical bound in the short blocklength regime, which is not possible using polar code alone or any of the existing mechanisms of the 5G channel coding methods.

SUMMARY

The present disclosure accordingly provides, in a first aspect, a computer implemented method of encrypting and decrypting data in a message for communication from a sender to a receiver, the sender and receiver having an encoder and decoder, respectively. The method can include encrypting the message using a combination of polar coding, cyclic redundancy checking, and parity checking in a manner that results in lower bit error rates (BER), higher transmission rates, and lower latency.

In another implementation, an encoder provides for sending messages using the method as described above. In another implementation, a decoder is provided that receives and processes messages according to the method provided above.

In another implementation, a method of encoding is provided. The method includes evaluating N channel reliabilities; selecting $M_0$ channels of the N channels based on each channel's relative reliability; constructing a polar code of $M_0$ information bits, the $M_0$ information bits arranged with a front and a rear; constructing a CRC code with $K_{CRC}$ additional bits; attaching the $K_{CRC}$ additional bits to the rear of the $M_0$ information bits; constructing a PC code with $K_{PC}$ parity bits; inserting the $K_{PC}$ parity bits at proper locations to yield a bit string, wherein the bit string is the sum of the M information bits, the attached $K_{CRC}$ additional bits, and the inserted $K_{PC}$ parity bits; identifying frozen bits in the bit string and setting the frozen bits to 0; feeding the bit string into a polar encoder; and obtaining a codeword $x_1^N$.

In another aspect, the method further includes constructing the PC code by partitioning the $M_0$ information bits into $K_{PC}$ segments, wherein each of the $K_{PC}$ segments corresponds to a PC equation.

In another aspect, the method further includes constructing the PC equation by generating channel reliability data; selecting non-frozen bits according to the channel reliability data; dividing the selected non-frozen bits into K segments; labeling non-frozen bits as unselected; evaluating, sequentially, each bit of each segment to select a most unreliable bit from each segment; and storing selected bits as a parity set.

In another aspect, an apparatus for encoding concatenated polar code is described. The apparatus evaluates N channel reliabilities and selects channels of the N channels based on each channel's relative reliability; constructs a polar code of $M_0$ information bits with a front and a rear; constructs a CRC code with $K_{CRC}$ additional bits and attaches the additional bits to the rear of the information bits; constructs a PC code with $K_{PC}$ parity bits and insert the parity bits at proper locations to yield a bit string which is the sum of the $M_0$ information bits, the attached $K_{CRC}$ additional bits, and the inserted $K_{PC}$ parity bits; identifies frozen bits in the bit string and setting the frozen bits to 0; feeds the bit string into a polar encoder and obtains a codeword; and is implemented, at least in part, by one or more hardware elements.

In another aspect, a successive cancellation list and bit flipping decoding method for decoding a concatenated polar code is described. The method includes receiving a codeword; initializing a log-likelihood ratio (LLR) of the codeword; inputting the initialized LLR into a decoder for decoder path decision; screening L paths; performing CRC check on the screened L paths and if the CRC check is not met; determining, in response to the CRC check not being met, at least one most unreliable bit based on an RCS; reversing a previous decision if the most unreliable bit was previously selected; and restarting the decoding method.

The above summary is not intended to describe each illustrated embodiment or every implementation of the subject matter hereof. The figures and the detailed description that follow more particularly exemplify various embodiments.

BRIEF DESCRIPTION OF THE DRAWINGS

The subject matter hereof may be more completely understood in consideration of the following detailed description of various embodiments in connection with the accompanying figures, in which.

Figure 1:
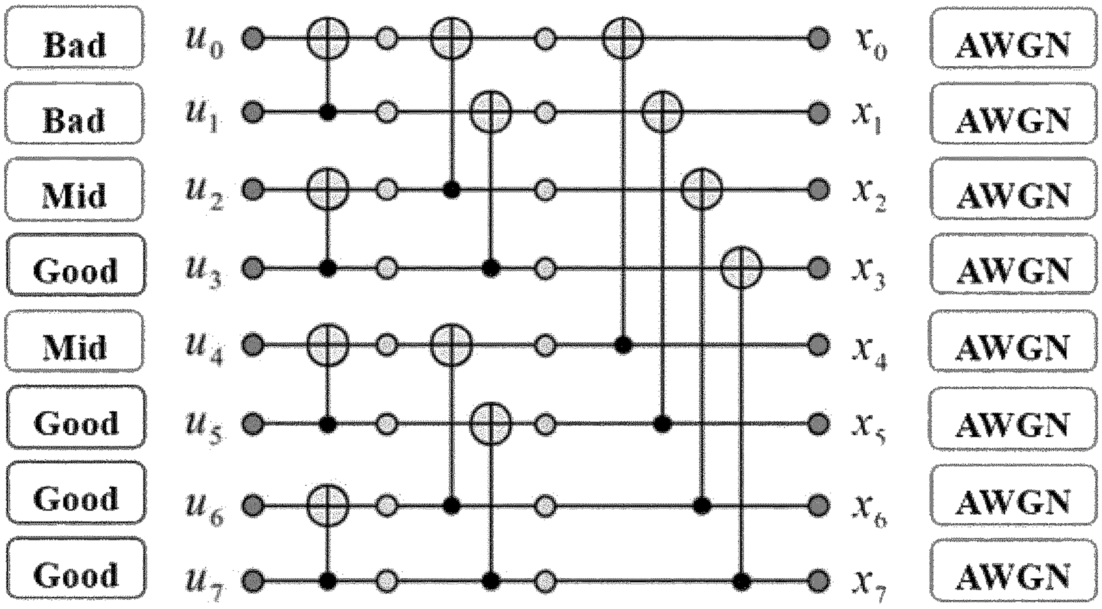
FIG. 1 is channel polarization with code length N=8.

While various embodiments are amenable to various modifications and alternative forms, specifics thereof have been shown by way of example in the drawings and will be described in detail. It should be understood, however, that the intention is not to limit the claims to the particular embodiments described. On the contrary, the intention is to cover all modifications, equivalents, and alternatives falling within the spirit and scope of the subject matter as defined by the claims.

DETAILED DESCRIPTION OF THE DRAWINGS

Improvements to encoding and decoding of messages are described throughout this application. These improvements are necessary in order to enable the next generation of data transmission, referred to as "6G" data transmission. The current standard for mobile data transmission, referred to as "5G," makes use of some features of polar encoding, a relatively recent encoding innovation first proposed by Erdal Arikan in 2008. Though polar coding is a strong base that has many theoretical advantages in information theory, 5G technology does not use polar coding to its best advantage to accomplish the speed, latency, and bit error rate needed for 6G standards.

Polar code has been proven to achieve the Shannon limit, but pure polar code cannot achieve the finite-length theoretical bound in the short blocklength regime. Channel polarization results in various subchannel reliabilities, as shown in the example in FIG. 1. This polarization allows bad, or noisy, channels to be frozen and good channels to be used more effectively. While subchannels tend to be completely polarized when $N \rightarrow \infty$, as a practical matter there are often a number of semi-polarized channels. In short blocklength, this kind of insufficient polarization results in performance penalties. Because semi-polarized subchannels waste some transmission capability, a concatenated polar code provides a solution as the outer code extracts information from semi-polarized subchannels.

The following terms and initialisms are used throughout the instant application:

Additive white Gaussian noise (AWGN) and binary input AWGN: Additive white Gaussian noise (AWGN) is a basic noise model used in information theory to mimic the effect of many random processes that occur in nature. Each modifier denotes specific characteristics: (1) additive because it is added to any noise that might be intrinsic to the information system; (2) white refers to the idea that it has uniform power across the frequency band for the information system; (3) Gaussian because it has a normal distribution in the time domain with an average time domain value of zero.

AWGN is often used as a channel model in which the only impairment to communication is a linear addition of wideband or white noise with a constant spectral density and a Gaussian distribution of amplitude.

A binary input AWGN channel is often used as a practical model in many digital communication schemes (such as transmission of data over a pair of wires). In practice, many types of noise sources are additive and independent of each other and thus, when added together, can be approximated by a zero-mean Gaussian random variable with some variance.

Bit-flipping: Inversion of a bit from 1 to 0, or 0 to 1.

Cyclic Redundancy Checking (CRC): A CRC is an error-detecting code used in digital networks and storage devices to detect accidental changes to raw data. Blocks of data entering these systems get a short check value attached, based on the remainder of a polynomial division of their contents. On retrieval, the calculation is repeated and, in the event the check values do not match, corrective action can be taken against data corruption.

Low-Density Parity Checking (LDPC): LDPC code is a linear error correcting code constructed using a sparse Tanner graph (subclass of the bipartite graph). These are capacity-approaching codes, meaning that practical constructions exist that allow the noise threshold to be set very close to the theoretical maximum (the Shannon limit) for a symmetric memoryless channel.

Successive Cancellation List (SCL) and SCL Flipping (SCLF): SCL decoding maintains a list of L most likely paths down to the bottom of a decoding tree. When decoding an information bit, the number of decoding paths is doubled (path duplication) until the list size reaches L without path selection. If the number of candidate paths reached equals L, then, in the next operation, 2L paths are generated and the best L paths are selected based on path metrics. For a frozen bit, the number of paths does not need to increase there is only one valid path (0). At the end a best path is selected from among L survivors.

An SCLF decoder integrated bit-flipping with an SCL decoder.

Parity checking (PC): A parity bit, or check bit, are added to a string of binary code as a simple form of error detecting code. Parity bits are generally applied to the smallest units of a communication protocol, typically 8-bit octets (bytes), although they can also be applied separately to an entire message string of bits.

Turbo codes: Turbo codes are a class of high-performance forward error correction (FEC) codes first published in 1993. The first practical codes to closely approach the maximum channel capacity or Shannon limit, turbo codes compete with low-density parity-check (LDPC) codes, which provide similar performance.

Shannon Limit: The Shannon-Hartley theorem defines a maximum rate at which information can be transmitted over a communications channel of a specified bandwidth in the presence of noise. It establishes Shannon's channel capacity for such a communication link, a bound on the maximum amount of error-free information per time unit that can be transmitted with a specified bandwidth in the presence of the noise interference, assuming that the signal power is bounded, and that the Gaussian noise process is characterized by a known power or power spectral density.

Pure polar code is inferior in performance to other state-of-the-art coding schemes such as Low-Density Parity-Check (LDPC) codes and Turbo codes. To improve a polar code's error-correction performance, the present disclosure describes code concatenation with polar code transmission. In the present disclosure, a CRC-PC-Polar code is presented along with an associated SCLFlip (SCLF) decoder. Multiple types of concatenated outer codes are configured to work cooperatively, in order to thoroughly utilize mutual information from half-polarized channels. The CRC-PC-Polar code is automatically constructed, based on heuristic code construction principles and other constraints on the Parity-Check equations, and then written by an automatic code construction program, according to embodiments of the present disclosure. A bit-flip-based decoder is disclosed and configured to correct erroneous blocks even if initial decoding attempts fail.

Each of CRC-Polar and PC-Polar alone offer some advantages, but it is together as a CRC-PC-Polar code that provides outcomes with both error-correction (from the PC layer) and error-detection (from the CRC layer).

In the present disclosure, a representative CRC-PC-Polar code concatenation scheme and an associated SCLF decoder are presented through various exemplary embodiments.

Polar Code Concatenation Scheme

At its core, polar coding is a mechanism for freezing unreliable channels while transmitting information on reliable channels. This is accomplished using a simple transform of data that is easily scalable. However, polar code, on its own, wastes some transmission capability due to inefficient use of semi-polarized channels. Concatenation of the polar code helps solve this problem, as the outer code extracts information from semi-polarized subchannels. In embodiments, the present disclosure considers concatenated polar codes for error-correcting codes through binary input AWGN channel (BI-AWGN) W. Referring now to FIG. 1, the blocklength of an example polar code is denoted as $N=2^n$, while the number of information bits is denoted as M. The coding rate is thus $$R = \frac{M}{N}.$$

The relationship between the bit signal-to-noise ratio $$\frac{E_b}{n_0}$$

and the noise variance $\sigma^2$ in the BI-AWGN channel can be represented as:

$$\sigma^2 = \frac{1}{2R\frac{E_b}{n_0}}$$

The generator matrix of polar code of blocklength N is given as:

$$G_N = F^{\otimes n}$$

Where $\otimes$ n denotes the n-th Kronecker product, and F is a 2×2 matrix:

$$F = \begin{bmatrix} 1 & 0 \\ 1 & 1 \end{bmatrix}$$

The square matrix $G_N$ transforms N copies of BI-AWGN channels $$W(y_1^h \mid x_1^N)$$

into N distinct synthesized sub-channels $$W_N^{(i)}:$$

$$W_N^{(i)}(y_1^N, u_1^{i-1}|u_i) = \frac{1}{2^{N-1}} \sum_{u_{i+1}^N \in F_2^{N-i}} W(y_1^N|u_1^N)$$

Where $$F_2^{N-1}$$

denotes the string of length (N−1) on the binary field, $$u_1^N$$

denotes the information sequence, and $$y_1^N$$

denotes the AWGN channel outputs. The encoding procedure is $$x_1^N = u_1^N G_N.$$

Due to channel polarization, the capacities of these channels $$I(W_N^{(i)})$$

polarize to a 0-1 random variable, with approximately a fraction I(W) of them becoming "good" channels with a capacity of 1-bit, and the rest of them becoming completely noisy (frozen channels) with a capacity of 0-bit. The code construction for polar codes, in embodiments, is configured to correctly pick M indices of these synthesized channels $$W_N^{(i)}$$

with the largest capacities, forming the set $\mathcal{A}$. The encoding procedure is to transmit M information bits on the selected good channels, while always sending 0 on the frozen, "bad" channels.

In embodiments, the code concatenation procedure may be done prior to the polar coding. For example, in an instance where the outer code attaches K additional redundant bits into M information bits, then a construct of the set $\mathcal{A}$ satisfying $|\mathcal{A}|$=M+K is needed, and then the transform $G_N$ applied to the construct.

In embodiments, the outer code chosen for a polar code may be a CRC error-detection code. The CRC bits may provide an SCL decoder with additional information to choose a correct decoding path. CRC bits may be attached to the tail of an uncoded information sequence $$u_1^N,$$

and then fed into the polar encoder. By example, such a CRC-Aided (CA)-SCL decoder was observed to have a performance gain of 0.5 dB over Turbo code.

Previous attempts at concatenating polar code report decoding failure if there is no candidate path passing the CRC test, thus causing an increase in FER. Though this is a disadvantageous situation, it is possible that the erroneous frame could be correctly decoded using additional information from the prior channel reliability. In the present disclosure, a bit-flip decoding method is adopted at least on these most unreliable bits after all typical CRC tests fail, which may then restart the decoder. This additional decoding attempt may avoid most of the frame errors, thus improving the error-correction performance.

Further, parity-check codes may be adopted as the outer code. Unlike with CRC codes, parity-check code scatters the parity bits among the information sequence to help the SCL decoder prune erroneous paths in a timely manner, instead of attaching the CRC bits at the tail of the information sequence. Heuristic parity-check bit location design and parity-check equation construction methods are proposed herein. Among all the frozen bits, a relatively more reliable bit may be chosen as a parity bit, and among all the information bits, a relatively more unreliable bit may be selected to participate in the parity checks. In embodiments, the relatively most reliable bit or most unreliable bit may be chosen to act as the parity bit or participate in the parity check. Concrete construction may depend on manual segmentation of the information sequence to ensure the scattered parity-check properties.

In traditional application of a parity-check outer code, the heuristic construction method of parity-check equations depends heavily on manual segmentation of the information sequence. In the present disclosure, an automatic construction method without manual labor is described.

Another outer CRC code may be added to the concatenation scheme to further improve the code performance.

In an example, the number of CRC bits may be $K_{CRC}$, the number of parity-check bits may be $K_{PC}$, and the number of information bits may be M. The length of the polar codeword may be $N=2^n$, with n polarization steps, and A being the index set of the chosen "good" sub-channels. Then the overall code rate is given as:

$$R = \frac{M}{N} = \frac{|\mathcal{A}| - K_{CRC} - K_{PC}}{N}$$

Figure 2:
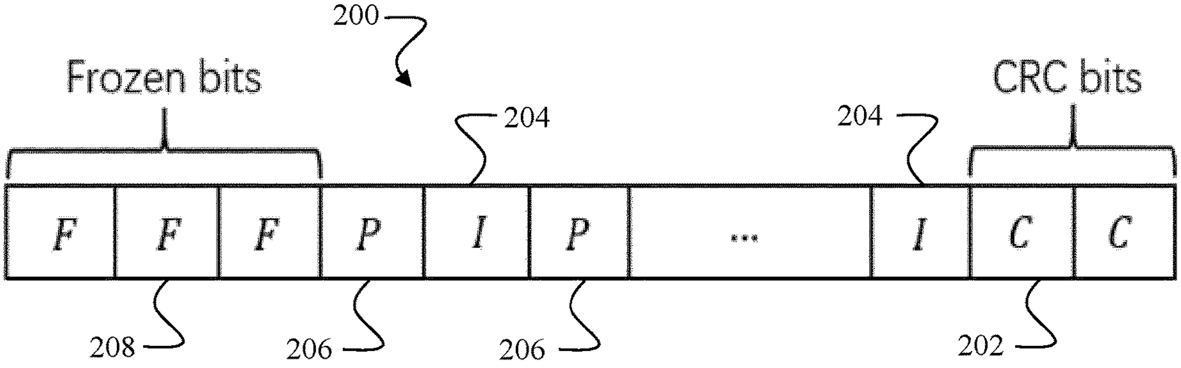
FIG. 2 is redundant bit distribution for an example code concatenation scheme, according to embodiments of the present disclosure.

The redundant bit distribution 200 for this example is illustrated in FIG. 2. In this example encoding scheme. $K_{CRC}$ CRC (C) 202 bits are attached to the rear of M information bits (I) 204, and then $K_{PC}$ parity-check bits (P) 206 are inserted at proper locations. Finally, $M_0=M+K_{CRC}+K_{PC}$ bits are fed into the polar encoder, together with the frozen bits (F) 208 being set to 0, to get the codeword $$x_1^N.$$

Thus, the code construction in this example can be divided into at least 3 operations: (1) the construction of polar codes with $M_0$ information bits, (2) the construction of CRC codes with $K_{CRC}$ additional bits, and (3) the construction of PC codes with $K_{PC}$ parity-check bits. There are four code construction parameters: in addition to M, $K_{PC}$, $K_{CRC}$, the design $E_b/n_0$ may also contribute to the pure polar code construction by GA. The N channel reliabilities may be evaluated by GA under the design parameter called design-$E_b/n_0$.

The CRC codes may be uniquely determined by generator polynomials. A number of example generator polynomials for use, according to embodiments of the present disclosure, are listed as follows:

| $K_{CRC}$ | Generator Polynomial |
|---|---|
| 4 | $x^4 + x + 1$ |
| 6 | $x^6 + x + 1$ |
| 8 | $x^8 + x^6 + x^3 + x^2 + 1$ |
| 10 | $x^{10} + x^9 + x^6 + x^3 + x^2 + x + 1$ |
| 12 | $x^{12} + x^{11} + x^3 + x^2 + 1$ |

A number of CRC generator polynomials are determined, and one or more parity-check equations are constructed. Simulation runs according to the present disclosure indicate that, for (512, 256) code of rate 1/2, the optimal value for $K_{CRC}$ may be 8, e.g., the third generator polynomial (in this example). However, for other code length and code rate, further investigation according to the present disclosure may indicate an alternative preferred $K_{CRC}$.

Construction of Parity-Check Equation

Using the GA method, $M_0$ relatively good channels are selected from N sub-channels. The $M_0$ bits are partitioned into $K_{PC}$ segments, with each of these segments corresponding to a parity-check equation. The $K_{PC}$ parity-check equations may be constructed by the following Algorithm 1 (which may be constructed or executed in MAT-Lab, for example), where $C_{k,j} \in [1:M_0]$ specifies the index of the j-th bit involved in the k-th parity equation:

| Algorithm 1: Parity-Check Equation Construction. | |
|---|---|
| Inputs: | The number of unfrozen bits $M_0$ |
| | The channel reliability $L_1^{M_0}$ given by GA |
| | Number of parity bits $K_{PC}$ |
| Outputs: | The k-th parity-check equation $\{C_{k,j}\}$ |
| 1: | ASSERT that $K_{PC}(K_{PC} + 1)/2 \le M_0$ Throw exception otherwise |
| 2: | $r \leftarrow M_0 - K_{PC}(K_{PC} + 1)/2$; $d \leftarrow \lfloor r/K_{PC} \rfloor$ |
| 3: | $s \leftarrow 1, j \leftarrow 1, B \leftarrow \text{cells}(K_{PC})$ |
| 4: | while $j \le K_{PC} - 1$ do |
| 5: | $B(j) \leftarrow (s{:}s + k - j + d)$ |
| 6: | $s \leftarrow 1 + s + k - j + d$ |
| 7: | end while |
| 8: | $B(K_{PC}) \leftarrow (s{:}\ K_{PC})$ |
| 9: | $U \leftarrow \text{false}(M_0), j \leftarrow 1$ |
| 10: | while $j \le K_{PC}$ do |
| 11: | $s \leftarrow 1$ |
| 12: | while $s \le j$ do |
| 13: | $C_{j,s} \leftarrow \text{find\_most\_unreliable}\left(B(s), U^c, L_1^{M_0}\right)$ |
| 14: | $U(C_{j,s}) \leftarrow 1$ |
| 15: | $s \leftarrow s + 1$ |
| 16: | end while |
| 17: | $j \leftarrow j + 1$ |
| 18: | end while |

The algorithm returns $K_{PC}$ parity-check equations with the bit indices encoded in $\{C_{k,j}\}$, $1 \le k \le K_{PC}$, $1 \le j \le k$.

Figure 3A:
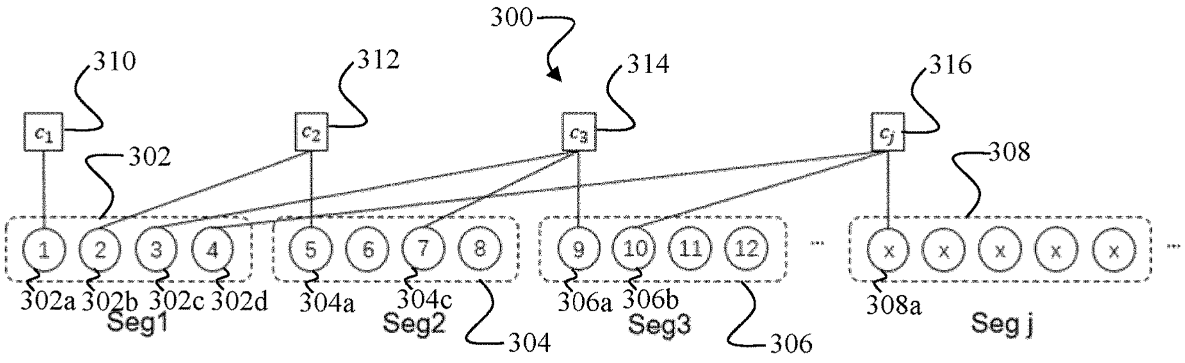
FIG. 3A is an illustration of the construction of a parity-check equation, according to embodiments of the present disclosure.

A parity-check relationship according to the present disclosure is illustrated in the string 300 of FIG. 3A. String 300 is grouped into segments 302, 304, 306, 308, where segments 302, 304, 306 are the first three segments in string 300 and segment 308 is the last segment, designated as segment j, in string 300. String 300 may include any number of segments between segments 306 and 308, depending on the total length of string 300. A first parity transform 310 is associated with a first parity check bit 302*a* in first module 302. A second parity transform 312 is associated with a sum of bit 302*b* of the first module 302 and a parity check bit 304*a* in the second module 304. A third parity transform 314 is associated with a sum of bit 302*c* of the first module 302, bit 304*c* of the second module 304, and a parity check bit 306*a* in the third segment 306. And so on, until a final parity transform 316 associated with a sum of bit 302*d* of the first segment 302, bit 306*b* of third segment 306, and a parity check bit 308*a* of the final segment 308.

Figure 3B:
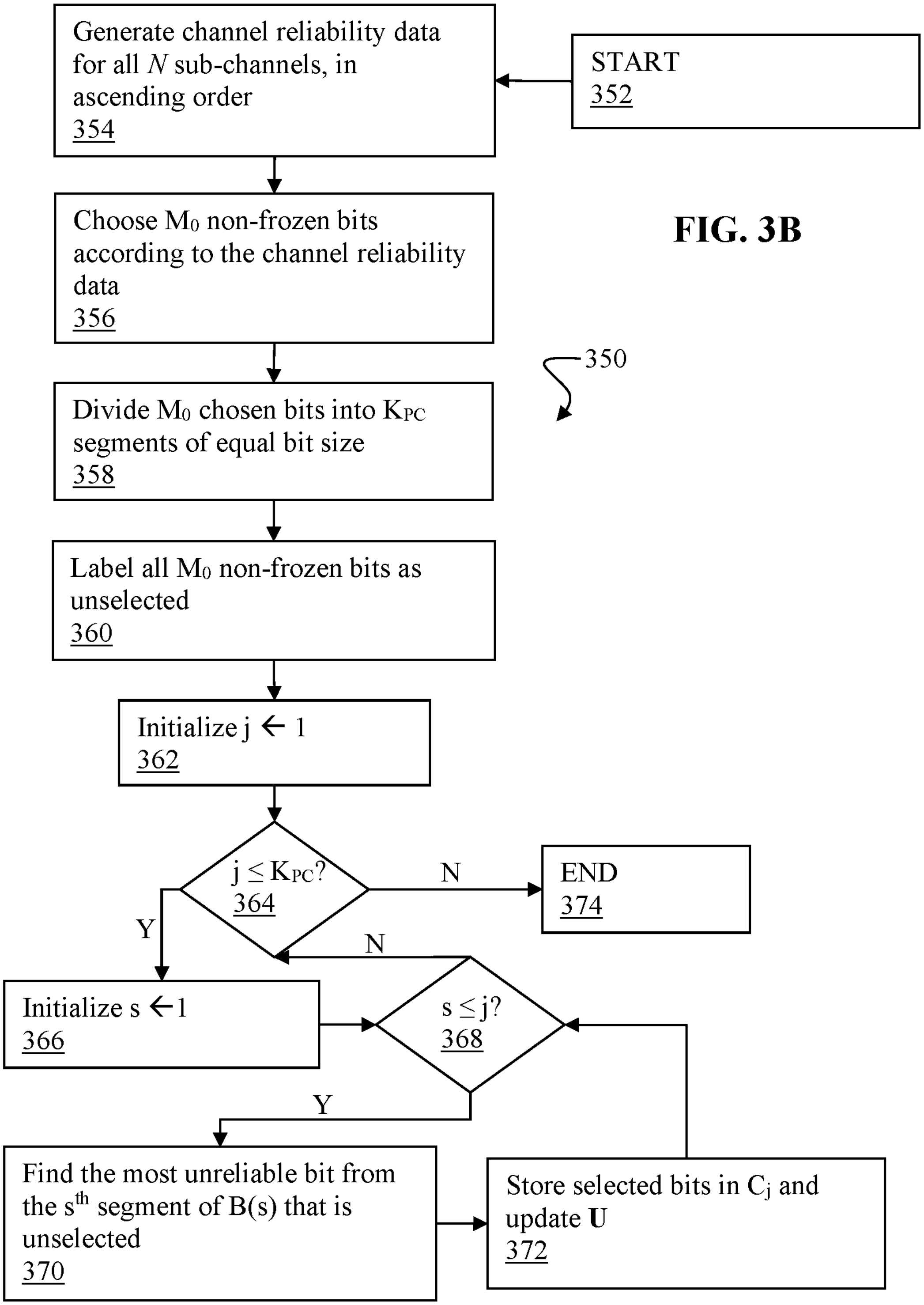
FIG. 3B is a flowchart depicting construction of a parity-check equation for concatenation with a polar code, according to embodiments of the present disclosure.

An example process of constructing a parity-check equation according to embodiments of the present disclosure, such as example Algorithm 1, is illustrated in the flowchart 350 in FIG. 3B. At a high level, this example process proceeds in three operations: (1) Evaluation; (2) Segmentation; and (3) Cross-segment parity-check.

At a more granular level, the parity-check equation process begins 352 and Evaluation proceeds. Channel reliability data is generated 354 by any known method, such as by application of the Gaussian Algorithm (GA). Determination of the channel reliability data, designated $$L_1^N,$$

may involve evaluation of all the N sub-channels, in ascending order. Evaluation may be executed and recorded by algorithms such as GA.

According to the code rate, $M_0$ of the non-frozen bits are chosen 356 according to the evaluation or the channel reliability data $$L_1^N.$$

Note that $M_0$ is composed of M information bits. $K_{PC}$ parity bits and $K_{CR}$c CRC bits.

Segmentation then proceeds and the $M_0$ or, in embodiments, all the non-frozen bits are partitioned into several ($K_{PC}$) segments 358. The segments, e.g., B(1), B(2), . . . , B($K_{PC}$), may be of equal bit size, or as near equal bit size as possible.

All of the $M_0$ non-frozen bits may be unselected at the beginning 360, such as by labelling vector U←F false ($M_0$).

The cross-segment parity-check proceeds and may initialize an outer loop (j←1) 362 for all ($j \le K_{PC}$) 364. During each iteration of the outer j-loop of the code construction algorithm, for consecutive segments B(1), B(2), . . . , B(j), a bit is chosen from each segment. To execute the choosing process, another inner loop (s←1) 366 is initialized to determine which bits to choose according to their reliability $$L_1^{M_0}.$$

In embodiments, the most unreliable bit from the $s^{th}$ segment, that is also unselected in U, is selected as the $s^{th}$ bit in the $j^{th}$ parity-check equation 370, i.e., $C_{j,s}$. The function find_most_unreliable returns the least reliable bit index that does not appear in U, i.e., this bit is the most unreliable bit that hasn't been parity-checked yet. Unreliable bits are chosen first, based on $$L_1^{M_0},$$

and the algorithm ensures that no bit is chosen twice. Selected bits are stored 372, e.g., into C, (note: $C_{j,s}$ is a 2-D array, and C, is its j-th row vector) to provide check bits and U is updated to exclude the already selected bits in $C_j$. After one iteration of the inner s-loop, the iteration variable is incremented by 1 (s→s+1), before returning to evaluation 368 so that the loop proceeds to the next segment. The same incrementation happens to the outer j-loop. Note that the number of bits that is chosen during each outer j-loop iteration is exactly j. Once all segments have been run through the parity-check loop (=$K_{PC}$) the equation construction ends 374.

A bit from each segment being checked is selected 370 according to the channel reliability data, such as that generated by GA, and this procedure may be carried out by a subroutine that finds the most unreliable sub-channel (supra, Line 13, Alg.1). Unreliable bits are chosen first, based on $$L_1^N,$$

and the algorithm ensures that no bit is chosen twice. In embodiments, the most unreliable bit from the $s^{th}$ segment, that is also unselected in U, is selected as B(s). The cell array B(s) stores the sub-channel indices of the $s^{th}$ segment, and the function find_most_unreliable returns the least reliable bit index that does not appear in U, i.e., this bit is the most unreliable bit that hasn't been parity-checked yet.

Selected bits are stored 372. e.g., $C_j$, to provide check bits and U is updated (s→s+1) before returning to evaluation 368 so that the loop proceeds to the next segment.

Bit Flip Decoder for Concatenated Polar Code Traditional decoding algorithms of polar codes can be divided into two categories: Successive Cancellation (SC) decoders and Belief Propagation (BP) decoders. SC decoders estimates the information sequence $$u_1^N$$

sequentially by calculating the Log Likelihood Ratio (LLR) of each $u_i$ recursively:

$$LLR(u_i) = \log\frac{\mathbb{P}[y_1^N, u_1^{i-1} | u_i = 0]}{\mathbb{P}[y_1^N, u_1^{i-1} | u_i = 1]}$$

And the decision is based on the sign of LLR($u_i$).

Based on classic SC decoders, an SCL decoder for a concatenated polar code has been proposed by introducing L copies of SC decoders. By keeping L paths simultaneously in the decoder, near-ML performance can be achieved by SCL. A SCLF decoder, which we propose, may only be adopted when there is an error-detection outer code. The disclosed CRC-PC-Polar concatenation scheme enables harvest of a performance gain from both bit-flip decoding and parity-checking.

Figure 4A:
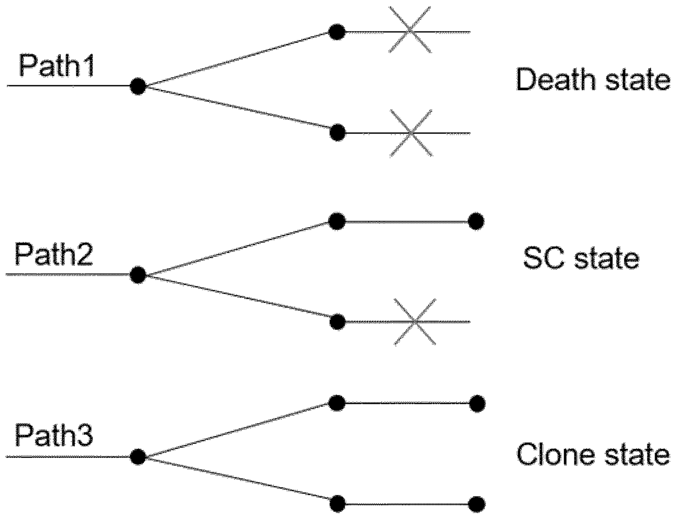
FIG. 4A shows three possible states of a given path during path duplication, according to embodiments of the present disclosure.

Referring now to FIG. 4A, three possible states for a given path during path duplication are shown. A path may experience a death state (path 1) or path pruning, an SC state (path 2), or a clone state (path 3). If an information bit only experiences path cloning (path 3) and path pruning (path 1) during the path duplication step, the bit-flip, or reversing the decision, is not meaningful because no additional decoding paths are explored. Therefore, a revised critical set (RCS) is created from a CS by eliminating those bits that cannot be flipped (e.g., frozen bits), parity bits which are determined by the previous information bits, and information bits which do not experience an SC state.

Figure 4B:
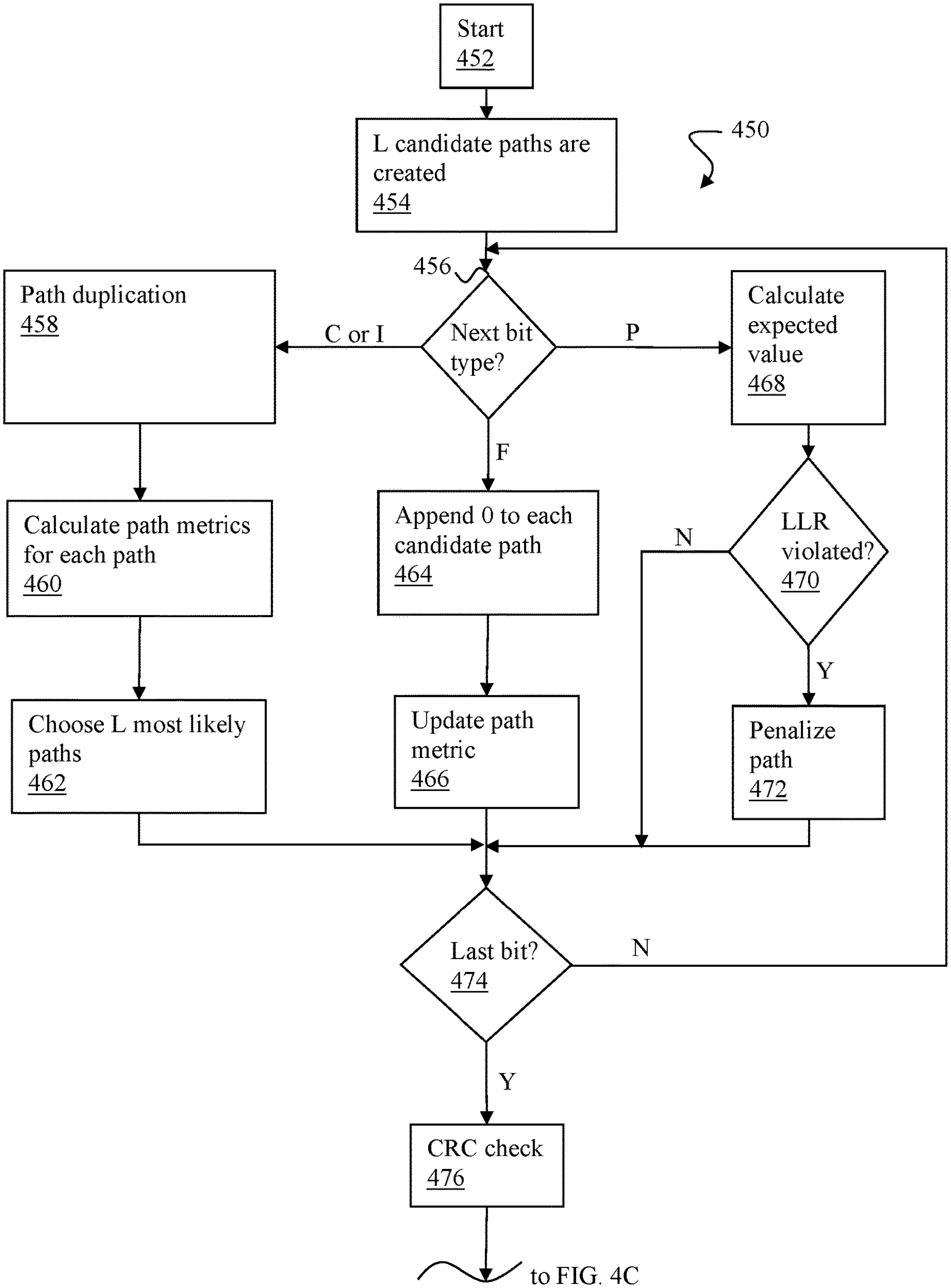
FIGS. 4B and 4C are a flowchart depicting decoding by a SCLF decoder according to embodiments of the present disclosure.
Figure 4C:
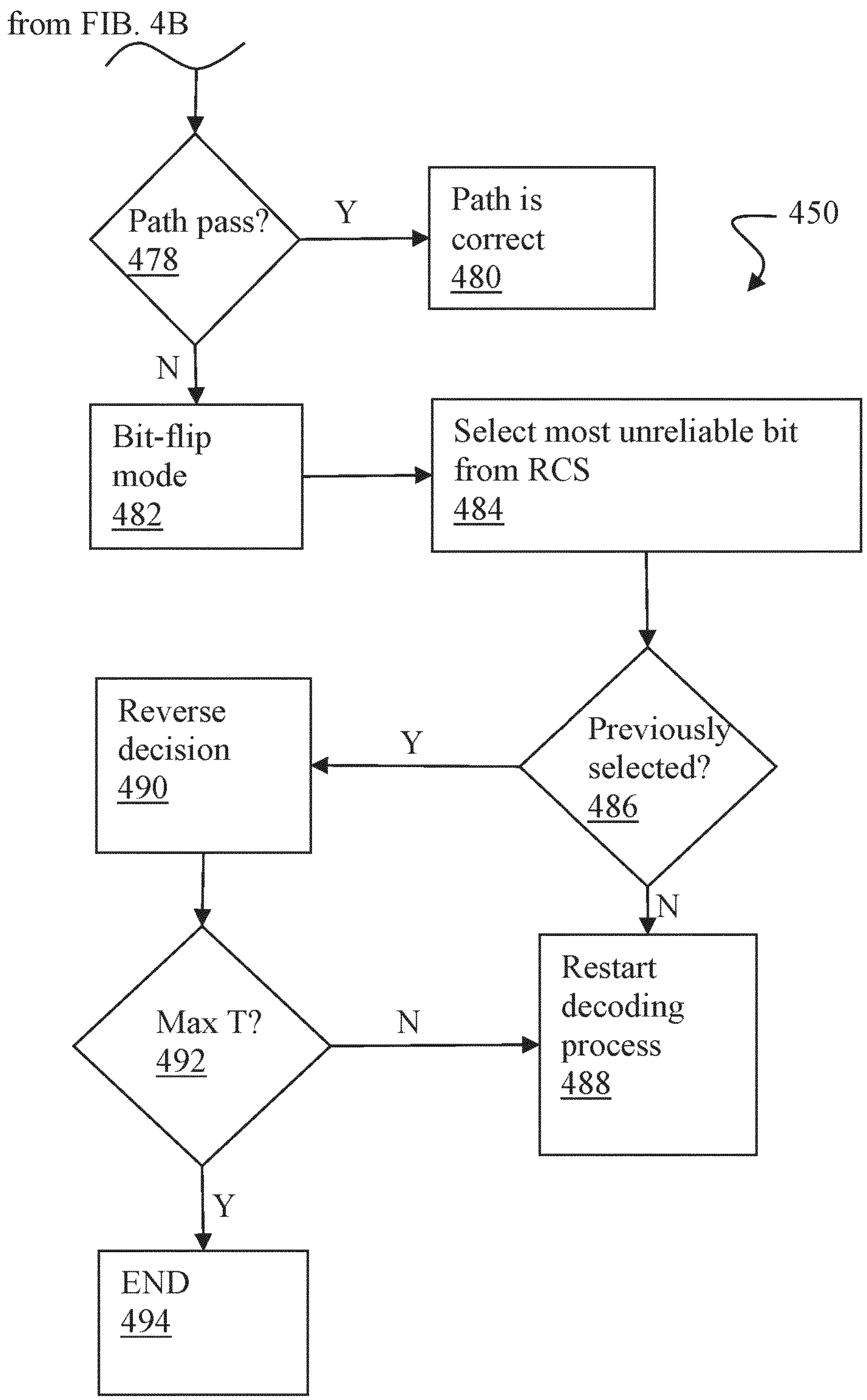

The decoding procedure disclosed herein shares characteristics with an SCL decoder. L identical SC decoders work in parallel as the decoding begins. The bits $$u_1^N$$

are decoded sequentially. Referring now to FIGS. 4B and 4C, a flowchart 450 depicts the operations of the decoding process.

Decoding begins 452, such as at a root node, and L candidate path are created 454. As the decoding proceeds, the bit LLRs of each decoding path are evaluated sequentially, and the fate of each decoding path is determined according to its type 456.

When decoding each information bit or CRC bit $u_i$, the two possibilities 0/1 are appended to each of the L candidate paths to create 2L decoding paths (path duplication) 458, and then path metrics for each path are calculated 460 in parallel from the LLR data received by $u_i$. L most likely paths are picked out 462, and the decoder goes on to the next bit.

When decoding a frozen bit, the path duplication is not carried out. The decoder simply appends 0 to each candidate path 464 and updates the path metric accordingly 466.

When decoding a parity-check bit, the expected value of this bit is calculated 468 from previously decoded bits based on the parity equation known to the decoder. If the expected value of this bit violates its LLR 470, then this path is penalized by a large path metric 472, thus aiding the decoder to prune unlikely paths in a timely manner.

Two additional parameters are fed into the SCLF decoder to enable decoding of the concatenated polar code: a maximum number of decoding attempts T, and an RCS.

Bits in a Critical Set (CS), which is composed of the first bit of the rate-1 subcode of the given polar code, have been found to be relatively most unreliable. Therefore, the RCS set of the present disclosure may be constructed from CS by eliminating bits which cannot be flipped, e.g., frozen or parity bits, which are determined by previous information bits and other information bits which do not experience an SC state (see FIG. 4A). If an information bit only experiences path cloning and path pruning during the path duplication, the bit-flip, or reversing the decision, may not be meaningful because no additional decoding paths are explored.

When the decoding procedure reaches the last bit 474 $u_N$, a CRC check is performed on each candidate path 476, and a path passing 478 the CRC test is chosen to be the correct information sequence 480. If there is no such path passing 478 the CRC test, the decoder enters the bit-flip mode 482. The decoder picks the most unreliable bit 484 from a pre-constructed set called the Revised Critical Set (RCS) and restarts the decoding process 488. The new decoding process reverses its decision 490 when reaching this selected bit to explore additional possibilities of the decoding path. Similar decoding operations are repeated, until either a correct codeword is found, or the maximum number of decoding attempts T is reached 492.

Figure 4D:
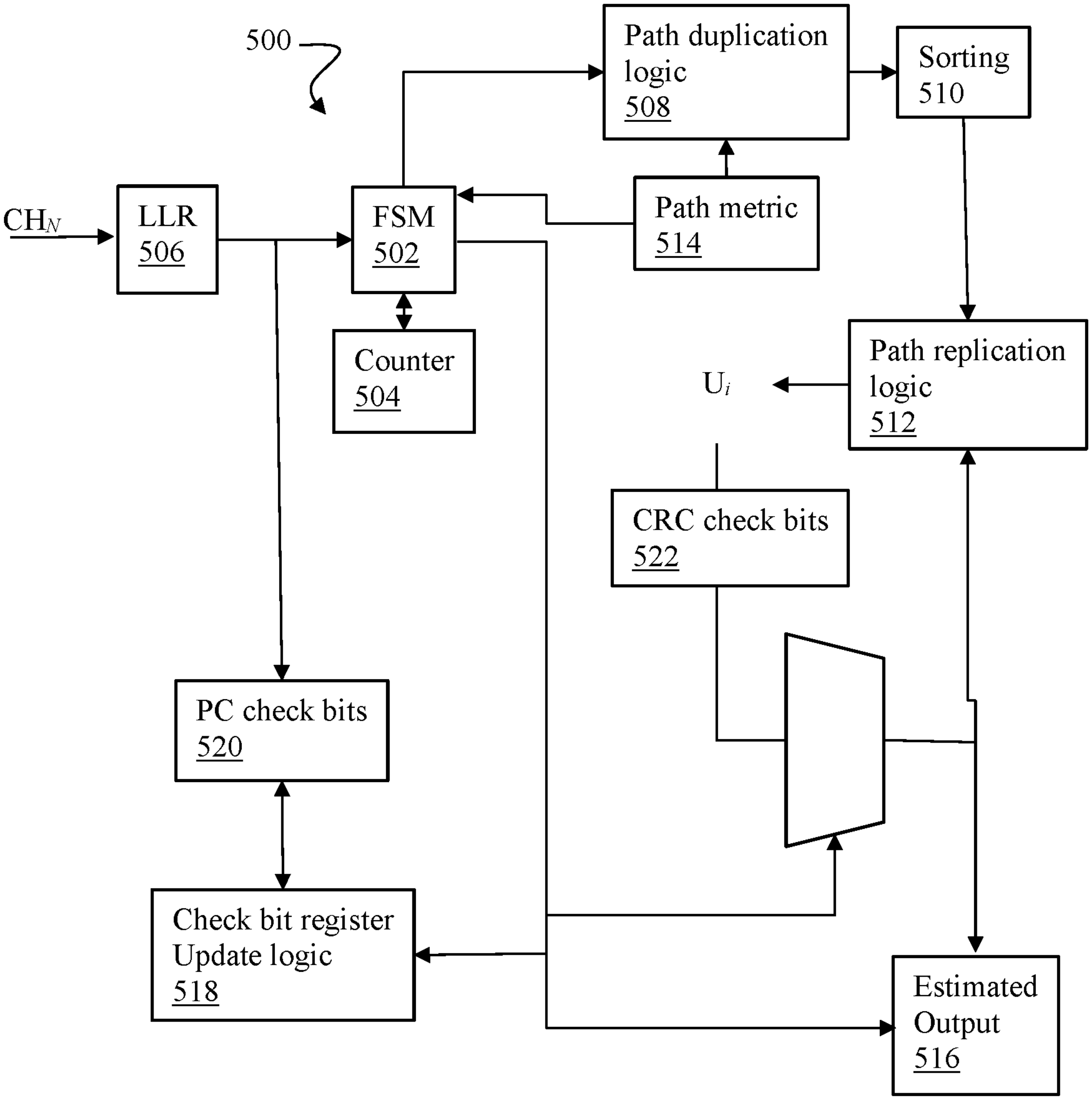
FIG. 4D is a block diagram of an example SCLF decoder, according to embodiments of the present disclosure.

Referring now to FIG. 4D, an example block diagram 500 of a hardware arrangement which may act as an SCLF decoder, according to embodiments of the present disclosure, is shown.

A central finite state machine 502 may provide a coordinating component for example decoder 500, communicating with a bit counter 504, channel LLR combination 506, path duplication logic 508, path metric 514, estimated output 516, and check bit register update logic 518. Path duplication logic 508 further communicates with sorting logic 510, which provides date to path replication logic 512. Path replication logic 512 communicates with estimated output 516 and interacts with bits to be evaluated $u_i$. PC check bits 520 are informed by channel LLR combination 506 and communicate with check bit register update logic 518. CRC check bits 522 are associated with bits to be evaluation $u_i$ and connect with estimated output 516 via a multiplexor.

Example

To demonstrate the disclosed encoding-decoding scheme, conducted simulation experiments, on CRC-PC-Polar codes with different construction parameters, are described. Simulation results demonstrate that this concatenated polar code outperforms CRC-Polar code and PC-Polar code without introducing obvious complexity penalties. The codes simulated in the present example are (512, 256) block codes.

The present example was conducted under design parameter $E_b/n_0$=1.5 dB. Note that this is a scalar parameter of a GA code construction algorithm. GA may be used to evaluate the sub-channel reliabilities before application of the party code construction algorithm (e.g., Algorithm 1, supra). Under a different design parameter, the reliabilities may differ slightly, thus resulting in small difference in the constructed polar code. It is specified for the sake of rigor, but may not substantially impact code performance.

Figure 5:
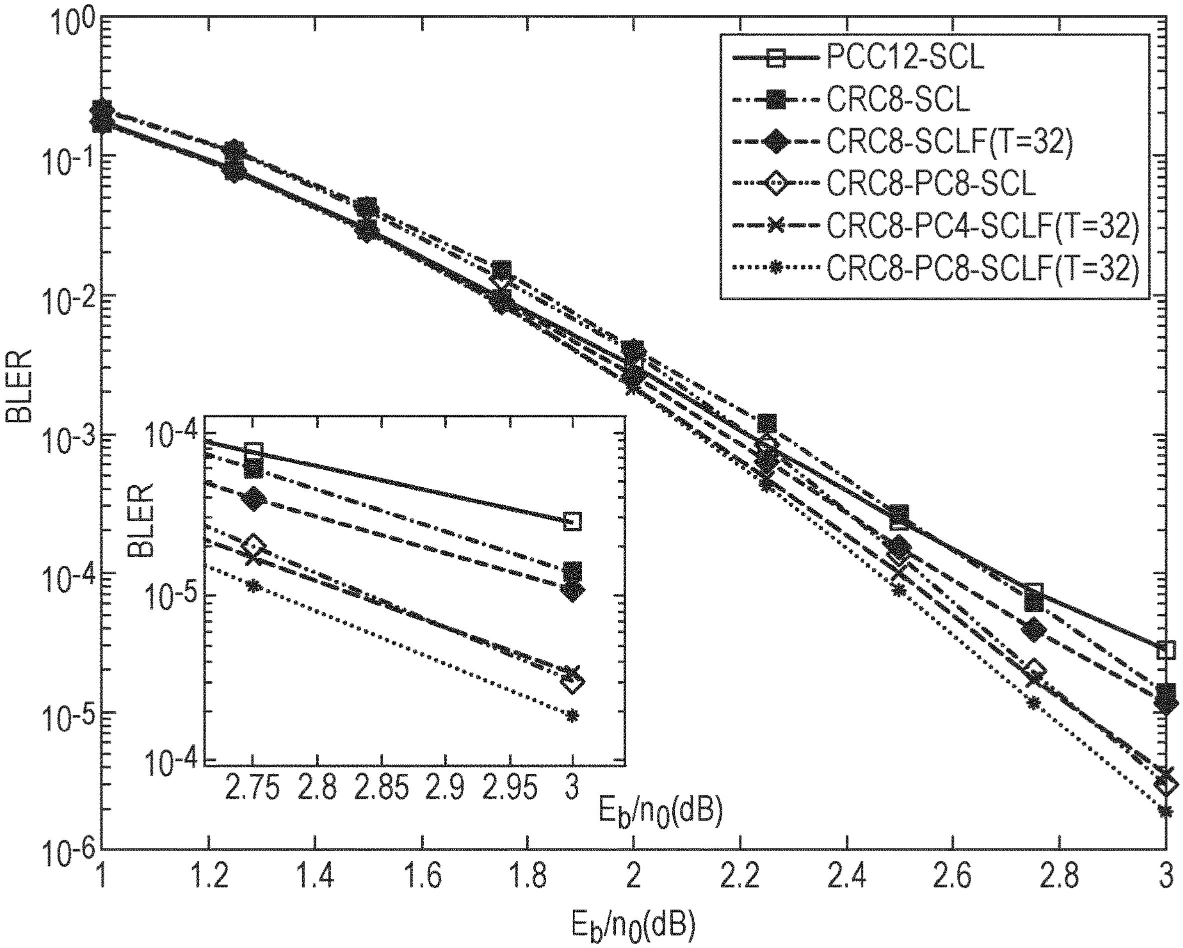
FIG. 5 is a simulated Block Error Rate (BLER) comparison for the proposed CRC-PC-Polar code under SCLF decoder.

Notice that the disclosed embodiments, PC-Polar and CRC-Polar codes under SCL decoder are special cases of CRC-PC-Polar codes under SCLF decoder (setting T=1, $K_{PC}$=0 will result in CRC-Polar code under SCL decoder), and the construction parameters need only be adjusted to generate the performance curve of these baseline methods. Simulation results in FIG. 5 demonstrate that embodiments of the disclosed scheme outperform CRC-Polar method by approximately 0.25 dB at BLER $10^{-5}$. Two curves with the lowest BLER represent embodiments of the disclosed methods (CRC8-PC8-SCLF, CRC8-PC4-SCLF).

Improved channel coding has perpetual significance in communication products. According to the simulation data, application of the teachings of the present disclosure reduces the block errors to approximately one-seventh at $E_b/n_0$=3 dB. Targeting the same BLER, better channel codes help reduce the transmitting power or improve the data transmission speed, thus improving users' experience and prolonging the standby time of mobile devices. Additional experiments conducted on the teachings of the present disclosure show that a SCLF decoder, embodying the teachings of the present disclosure, introduces negligible complexity increment at high-SNR region and can be implemented by FPGA with low resource requirements.

Suitably, computer programs as described herein can be stored on a carrier medium in machine or device readable form, for example in solid-state memory, magnetic memory such as disk or tape, optically or magneto-optically readable memory such as compact disk or digital versatile disk, etc., and the processing device uses the program or a part thereof to configure it for operation. The computer program may be supplied from a remote source embodied in a communications medium such as an electronic signal, radio frequency carrier wave or optical carrier wave. Such carrier media are also envisaged as aspects of the present disclosure.

It will be understood by those skilled in the art that, although the present disclosure has been described in relation to the above described example embodiments, the disclosure is not limited thereto and that there are many possible variations and modifications which fall within the scope of the disclosure.

The scope of the present disclosure includes any novel features or combination of features disclosed herein. The applicant hereby gives notice that new claims may be formulated to such features or combination of features during prosecution of this application or of any such further applications derived therefrom. In particular, with reference to the appended claims, features from dependent claims may be combined with those of the independent claims and features from respective independent claims may be combined in any appropriate manner and not merely in the specific combinations enumerated in the claims.

Various embodiments of systems, devices, and methods have been described herein. These embodiments are given only by way of example and are not intended to limit the scope of the claims. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claims.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A method of encoding and transmitting a codeword, comprising:

evaluating reliabilities of N channels under a design parameter $E_b/n_0$;

selecting $M_0$ channels of the N channels based on a relative reliability of each channel;

constructing a polar code of $M_0$ information bits, the $M_0$ information bits arranged with a front and a rear;

constructing a cyclic redundancy checking (CRC) code with $K_{CRC}$ additional bits;

attaching the $K_{CRC}$ additional bits to the rear of the $M_0$ information bits;

constructing a Parity Check (PC) code with $K_{PC}$ parity bits by:

partitioning the $M_0$ information bits into $K_{PC}$ segments, wherein each of the $K_{PC}$ segments corresponds to a PC equation, wherein constructing the PC equation comprises:

generating channel reliability data;

selecting non-frozen bits according to the channel reliability data;

dividing the selected non-frozen bits into K segments;

evaluating, sequentially, each bit of each segment to select a most unreliable bit from each segment that has not already been selected; and storing selected bits as a parity set, wherein the PC equation for each segment of the $K_{PC}$ segments is associated with a sum of a parity check bit of the segment and only the most unreliable bit of each preceding segment that has not already been selected;

inserting the $K_{PC}$ parity bits at proper locations to yield a bit string, wherein the bit string is a concatenation of the $M_0$ information bits, the attached $K_{CRC}$ additional bits, and the inserted $K_{PC}$ parity bits;

inserting frozen bits to the bit string and setting the frozen bits to 0;

feeding the bit string into a polar encoder;

obtaining a codeword $x_1^N$; and transmitting a signal comprising the codeword $x_1^N$.

2. An apparatus for encoding and transmitting a concatenated polar codeword, comprising:

one or more hardware elements configured to:

evaluate reliabilities of N channels under a design parameter $E_b/n_0$ and select $M_0$ channels of the N channels based on a relative reliability of each channel;

construct a polar code of $M_0$ information bits, the $M_0$ information bits arranged with a front and a rear;

construct a cyclic redundancy checking (CRC) code with $K_{CRC}$ additional bits and attach the $K_{CRC}$ additional bits to the rear of the $M_0$ information bits;

construct a Parity Check (PC) code with $K_{PC}$ parity bits by:

partitioning the $M_0$ information bits into $K_{PC}$ segments, wherein each of the $K_{PC}$ segments corresponds to a PC equation, wherein constructing the PC equation comprises:

generating channel reliability data, selecting non-frozen bits according to the channel reliability data, dividing the selected non-frozen bits into K segments, evaluating, sequentially, each bit of each segment to select a most unreliable bit from each segment that has not already been selected, and storing selected bits as a parity set, wherein the PC equation for each segment of the $K_{PC}$ segments is associated with a sum of a parity check bit of the segment and only the most unreliable bit of each preceding segment that has not already been selected;

insert the parity bits at proper locations to yield a bit string, wherein the bit string is a concatenation of the M information bits, the attached $K_{CRC}$ additional bits, and the inserted parity bits;

insert frozen bits to the bit string and setting the frozen bits to 0;

feed the bit string into a polar encoder and obtain a concatenated polar codeword $x_1^N$; and transmitting a signal comprising the concatenated polar codeword $x_1^N$.

3. A successive cancellation list and bit flipping decoding method for decoding a concatenated polar codeword encoded by the method of claim 1, the concatenated polar codeword comprising a polar code with $M_0$ information bits, a cyclic redundancy checking (CRC) code with $K_{CRC}$ additional bits, and a parity check code with $K_{PC}$ parity check bits, the method comprising:

receiving a signal comprising the concatenated polar codeword;

initializing a log-likelihood ratio (LLR) of the concatenated polar codeword;

inputting the initialized LLR into a decoder for a decoder path decision;

screening L paths;

performing a CRC check on the screened L paths and if the CRC check is not met:

determining, in response to the CRC check not being met, at least one most unreliable bit based on a Revised Critical Set (RCS), the RCS being a Critical Set without frozen bits or parity check bits which are determined by previous information bits; and restarting the method, wherein inputting the initialized LLR into the decoder for the decoder path decision includes reversing the decoder path decision of the determined most unreliable bit.

* * * * *